United States Patent
Miyazawa

(10) Patent No.: US 8,479,385 B2
(45) Date of Patent: Jul. 9, 2013

(54) METHOD OF PRODUCING WIRING SUBSTRATE

(75) Inventor: Hiroyuki Miyazawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 22 days.

(21) Appl. No.: 13/233,076

(22) Filed: Sep. 15, 2011

(65) Prior Publication Data

US 2012/0073131 A1 Mar. 29, 2012

(30) Foreign Application Priority Data

Sep. 24, 2010 (JP) ................................. 2010-213333

(51) Int. Cl.
*H01R 9/00* (2006.01)

(52) U.S. Cl.
USPC ................... 29/842; 29/830; 29/832; 29/840; 29/852

(58) Field of Classification Search
USPC ................... 29/830, 832, 833, 837, 840, 852, 29/842
See application file for complete search history.

(56) References Cited

U.S. PATENT DOCUMENTS

| 4,617,730 A * | 10/1986 | Geldermans et al. ........... 29/843 |
| 8,079,142 B2 * | 12/2011 | Sakamoto et al. .............. 29/852 |
| 8,119,929 B2 * | 2/2012 | Horiuchi et al. .............. 174/262 |
| 2009/0126981 A1 * | 5/2009 | Horiuchi et al. .............. 174/262 |

FOREIGN PATENT DOCUMENTS

| JP | 2000-243869 | 9/2000 |
| JP | 2004-311598 | 11/2004 |
| JP | 2009-117703 | 5/2009 |

* cited by examiner

*Primary Examiner* — Carl Arbes
(74) *Attorney, Agent, or Firm* — IPUSA, PLLC

(57) ABSTRACT

A method of producing a wiring substrate includes producing a substrate body including a first primary surface on which a semiconductor chip mounting area is provided and a second primary surface opposed to the first primary surface; attaching a stiffener member on the first primary surface, the stiffener member including an opening which the semiconductor chip mounting area is exposed from; and connecting lead pins to corresponding connection pads provided on the second primary surface by way of electrically conductive members.

11 Claims, 12 Drawing Sheets

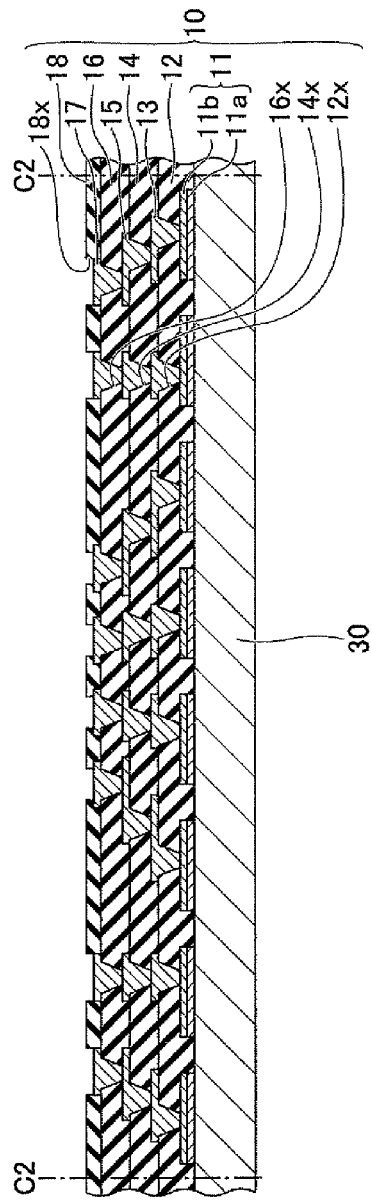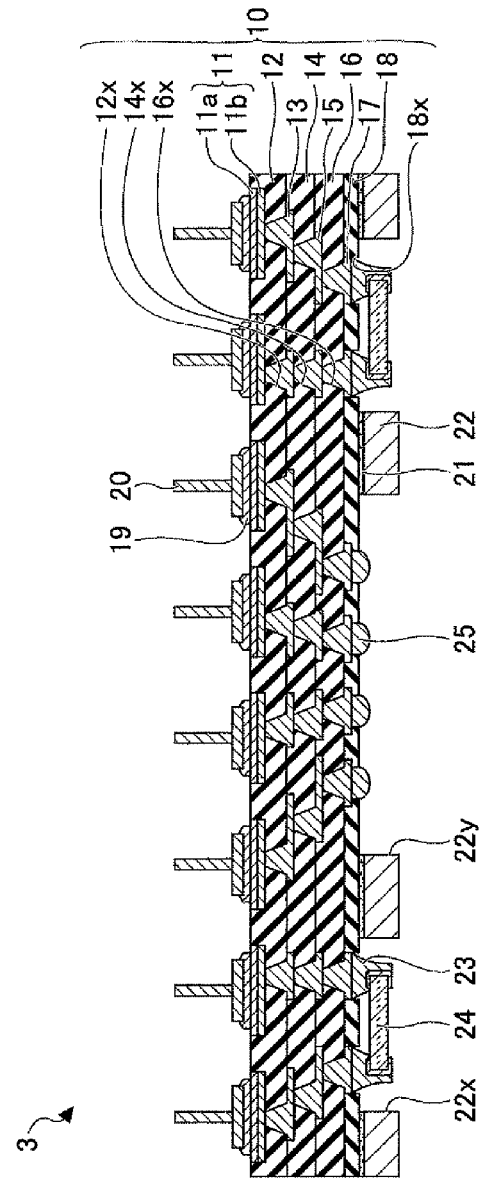

METHOD OF PRODUCING WIRING SUBSTRATE

CROSS-REFERENCE TO RELATED APPLICATIONS

This application is based upon and claims the benefit of priority of the prior Japanese Patent Application No. 2010-213333, filed on Sep. 24, 2010, the entire contents of which are incorporated herein by reference.

FIELD

The embodiment discussed herein is directed to a wiring substrate having a stiffener member.

BACKGROUND

A wiring substrate having a stiffener member has been known. The stiffener member is provided on the wiring substrate in order to reduce warpage of the wiring substrate, especially a careless substrate.

FIG. 1 is a cross-sectional view of a related art wiring substrate having a stiffener member. Referring to FIG. 1, a wiring substrate 100 is a so-called pin grid array wiring substrate having a careless resin substrate 110, a stiffener member 120, and lead pins 130. The stiffener member 120 may be formed of a metal member having, for example, a shape of a frame, and is attached on a peripheral part of a first primary surface 110a of the resin substrate 110 with an adhesive or the like. The lead pins 130 serve as external connection terminals, and are provided on corresponding connection pads of a second primary surface 110b of the resin substrate 110. A semiconductor chip 200 is mounted on the wiring substrate 100.

In the wiring substrate 100 so configured, warpage of the resin substrate 110 can be relatively reduced because the stiffener 120 is attached on the peripheral part of the resin substrate 110.

Next, a producing method of the wiring substrate 100 on which the semiconductor chip 200 is mounted is explained. FIGS. 2 and 3 illustrate producing processes of a related art method of producing the wiring substrate having the stiffener member. First, in a process illustrated in FIG. 2, the stiffener member 120 is attached on the peripheral part of the first primary surface 110 of the resin substrate 100 that is made in accordance with a known producing method. Next, in a process illustrated in FIG. 3, the semiconductor chip 200 is mounted by way of solder in an area surrounded by the stiffener member 120 on the first primary surface 110a of the resin substrate 110. Then, after the process illustrated in FIG. 3, the lead pins 120 are attached on the corresponding connection pads of the second primary surface 110b of the resin substrate 110, and thus the wiring substrate 100 illustrated in FIG. 1, on which the semiconductor chip 200 is mounted, is obtained.

SUMMARY

In the process illustrated in FIG. 3, the semiconductor chip 200 is placed on the resin substrate 110 by way of solder, and the resin substrate 110 and the semiconductor chip 200 are heated to temperatures higher than a melting point (e.g., 230° C.) of the solder in a so-called reflow furnace, and then cooled, thereby mounting the semiconductor chip 200 in the area surrounded by the stiffener member 120.

Here, there are differences in linear expansion coefficients among the resin substrate 110 that is formed of epoxy resin or the like, the stiffener member 120 that is formed of metal, and the semiconductor chip 200 that includes silicon. Therefore, when these three members (or components) are heated and then cooled thereby to attach the semiconductor chip on the resin substrate 10, the resin substrate 110 may be warped even when the stiffener member 120 is employed.

If the warpage is not sufficiently reduced, the lead pins 130 may be mounted in positions deviated from designed positions in the process after the process illustrated in FIG. 3. In other words, positional accuracy of the lead pins 130 is degraded.

Accordingly, it is an object in one aspect of the present invention to provide a method of producing a wiring substrate that is capable of improving a positional accuracy of lead pins that serve as external connection terminals.

According to a first aspect of the invention, there is provided a method of producing a wiring substrate, comprising producing a substrate body including a first primary surface on which a semiconductor chip mounting area is provided and a second primary surface opposed to the first primary surface; attaching a stiffener member on the first primary surface, the stiffener member including an opening which the semiconductor chip mounting area is exposed from; and connecting lead pins to corresponding connection pads provided on the second primary surface by way of electrically conductive members after attaching the stiffener member on the first primary surface.

BRIEF DESCRIPTION OF DRAWING

FIG. 17 is an explanatory view for explaining a production process of a wiring substrate according to an altered example of the embodiment of the present invention; and FIG. 18 is another explanatory view for explaining the production process of the wiring substrate according to the altered example of the embodiment of the present invention, following FIG. 17.

DESCRIPTION OF EMBODIMENT(S)

Preferred embodiments of the present invention will be explained with reference to the accompanying drawings. In the accompanying drawings, a similar or corresponding reference symbols are given to a similar or corresponding members or components, and repetitive explanation may be omitted.

(Wiring Substrate Configuration)

Figure 1:
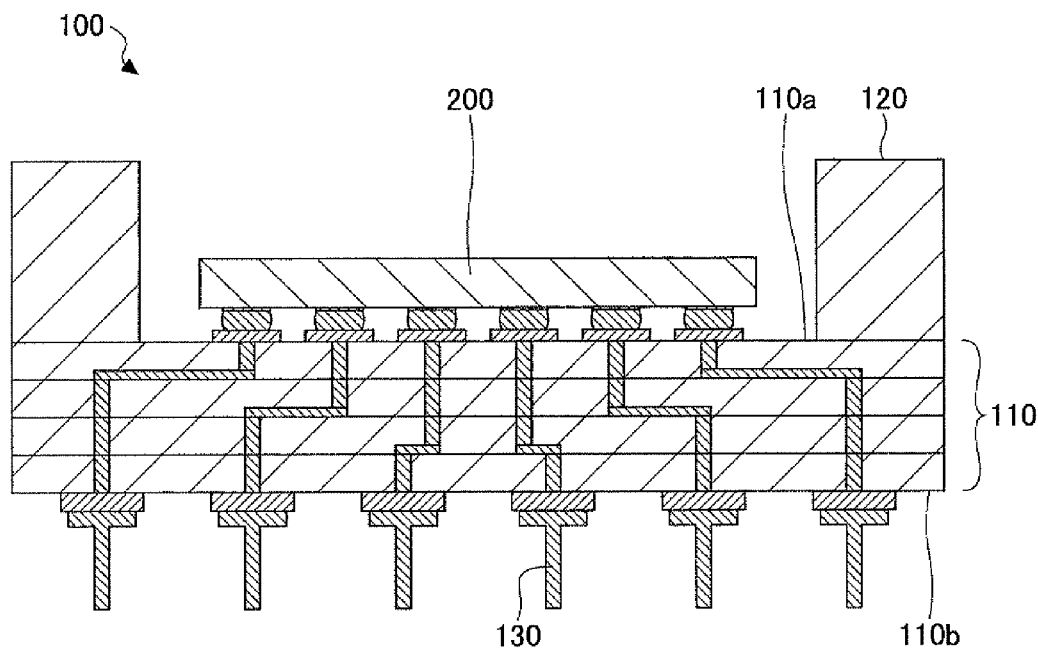
FIG. 1 is a cross-sectional view exemplifying a related art wiring substrate having a stiffener.
Figure 2:
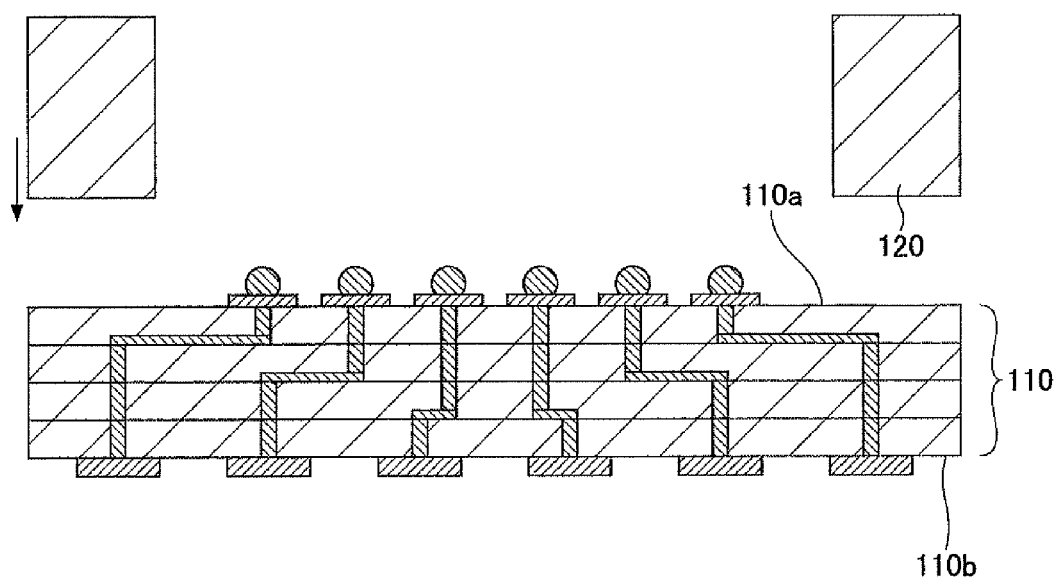
FIG. 2 illustrates a production process of a related art wiring substrate having a stiffener.
Figure 3:
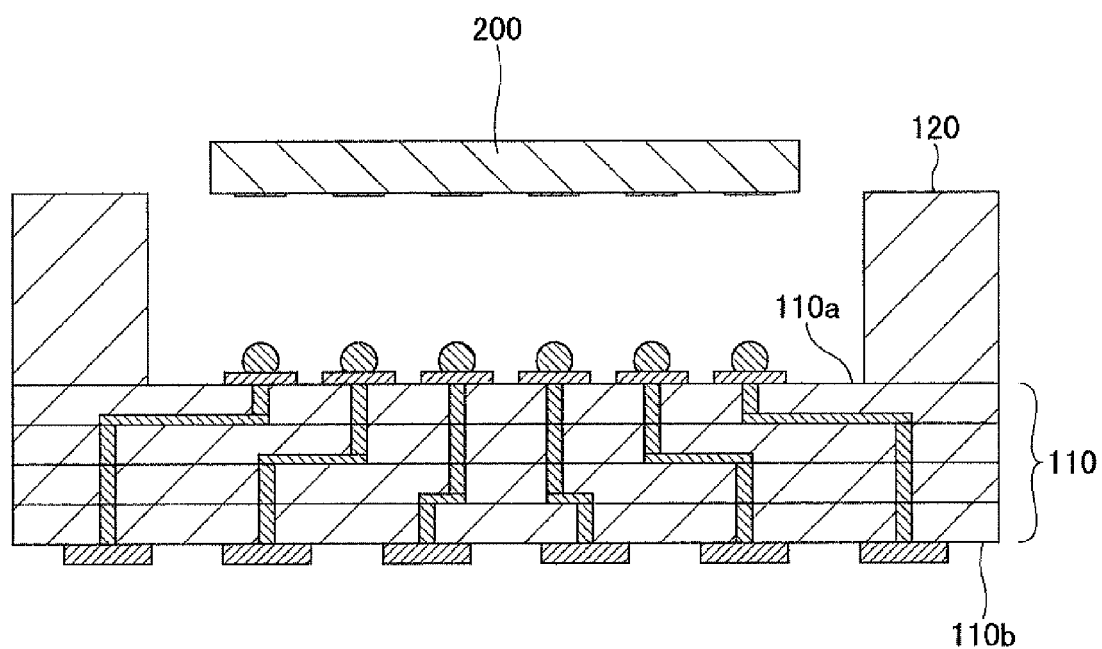
FIG. 3 illustrates the production process of the related art wiring substrate having a stiffener, following FIG. 2.
Figure 4:
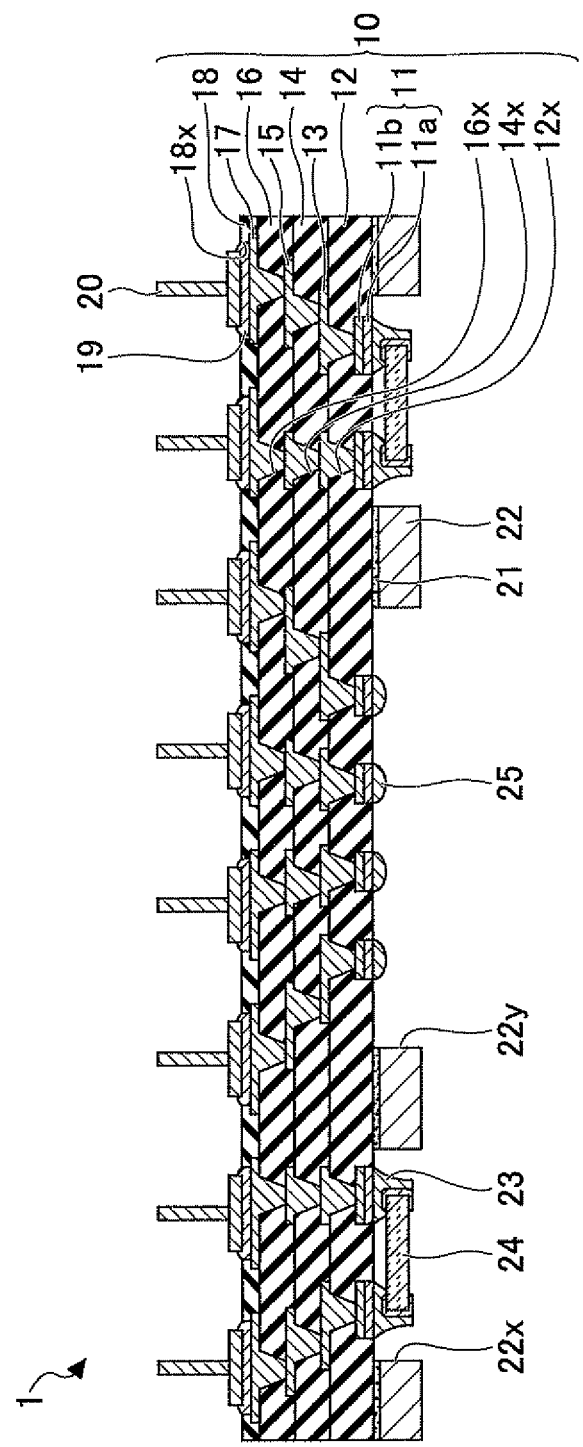
FIG. 4 is a cross-sectional view illustrating a wiring substrate according to an embodiment of the present invention.
Figure 5:
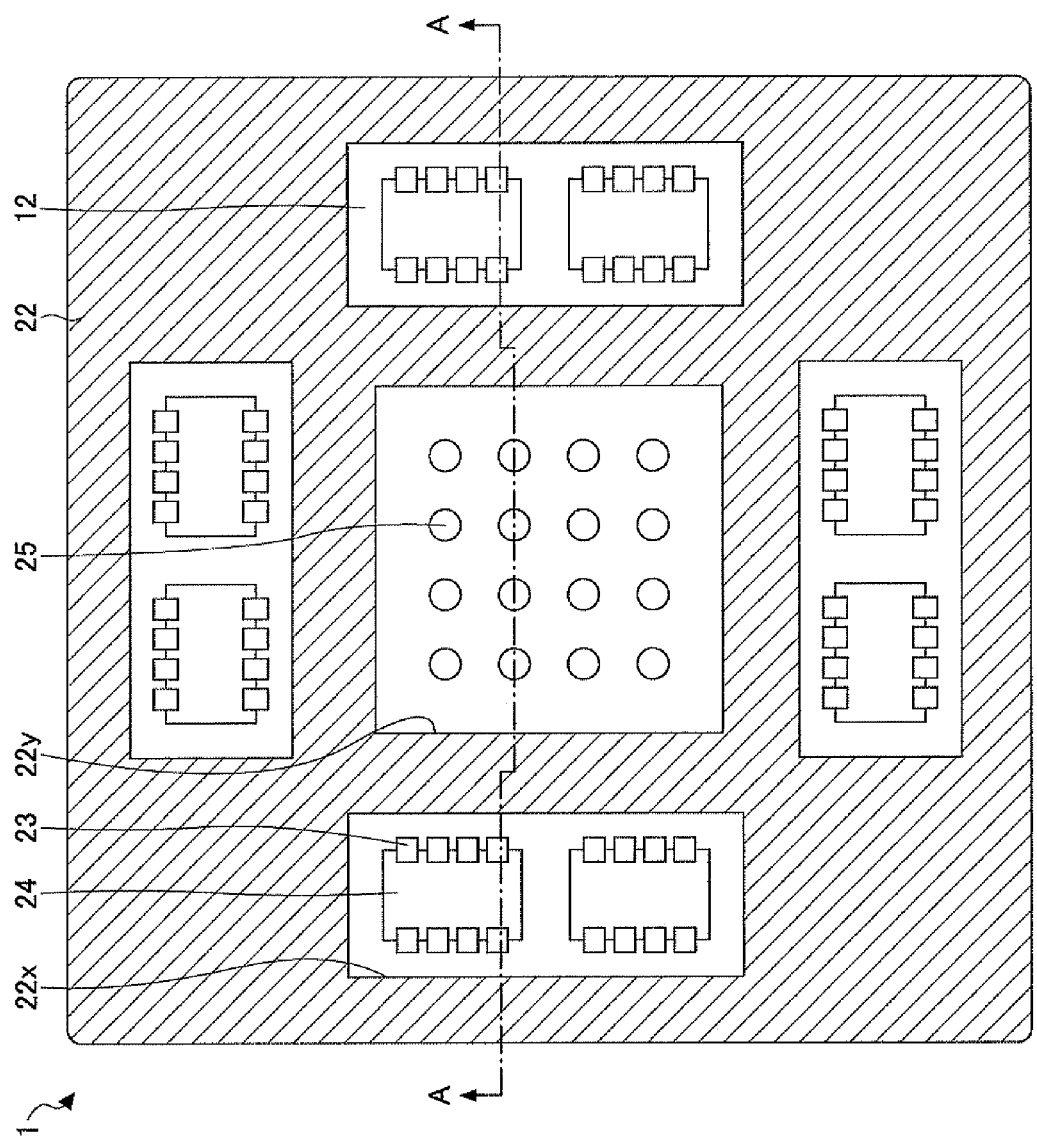
FIG. 5 is a bottom view illustrating the wiring substrate according to the embodiment of the present invention.

First, a configuration of a wiring substrate according to an embodiment of the present invention is explained. FIG. 4 is a cross-sectional view illustrating a wiring substrate according to this embodiment. FIG. 5 is a bottom view illustrating the wiring substrate according to this embodiment. Incidentally, FIG. 4 is taken along A-A line in FIG. 5.

Referring to FIGS. 4 and 5, a wiring substrate 1 according to this embodiment includes a substrate body 10, electrically conductive members 19, lead pins 20, adhesive layers 21, a stiffener member 22, electric parts 24, and bumps 25. In the following explanation, a surface on which the lead pins 20 are provided is referred to as an upper surface, and the opposite surface, on which the bumps 25 are provided or a semiconductor chip is mounted, is referred to as a lower surface.

The substrate body 10 is a careless multilayer wiring substrate formed by stacking a first wiring layer 11, a first insulation layer 12, a second wiring layer 13, a second insulation layer 14, a third wiring layer 15, a third insulation layer 16, a fourth wiring layer 17, and a fourth insulation layer 18 in this order. The substrate body 10 may have a size of, for example, 40 mm (width)×40 mm (depth)×350 μm (thickness).

In the substrate body 10, the first wiring layer 11 includes a first layer 11a and a second layer 11b. A part of the first layer 11a, which constitutes the first wiring layer 11, is exposed from the first insulation layer 12. The first layer 11a may be formed by stacking, for example, a gold (Au) film, a palladium (Pd) film, and a nickel (Ni) film so that the gold film is in openings of the first insulation layer 12. Alternatively, the first layer 11a may be made by stacking, for example, a gold (Au) film and a nickel (Ni) film so that the gold film is exposed in openings of the first insulation layer 12. As for the second layer 11b, an electrically conductive layer including, for example, a copper layer or the like may be used.

For example, a thickness of the first wiring layer 11 may be adjusted to about 10-30 μm. Parts of the first wiring layer 11 formed on a semiconductor chip mounting area (described later), which are exposed from the first insulation layer 12, function as connection pads for forming bumps 25. Incidentally, a surface of the wiring substrate 10 on the side of the first wiring layer 11 may be referred to as a first primary surface.

The first insulation layer 12 is formed in order to cover the upper surface, which is connected to via wirings of the second wiring layer 13, and a side surface of the first wiring layer 11. The lower surface (a surface opposite to the surface on which the via wirings are formed) of the first wiring layer 11 is exposed from the first insulation layer 12. For example, a material of the first insulation layer 12 may be insulating resins such as an epoxy resin and a polyimide resin. A thickness of the first insulation layer 12 may be, for example, about 50 μm.

The second wiring layer 13 is formed on the first insulation layer 12. The second wiring layer 13 is configured to include via wirings filled in first via holes 12x that go through the first insulation layer 12 thereby to allow parts of the upper layer of the first wiring layer 11 to be exposed within the first via holes 12x, and a wiring pattern formed on the first insulation layer 12. The second wiring layer 13 is electrically connected with the first wiring layer 11 exposed in the first via holes 12x. For example, copper (Cu) and the like may be used as a material of the second wiring layer 13. A thickness of the wiring pattern that constitutes the second wiring layer 13 may be, for example, about 15-20 μm.

The second insulation layer 14 is formed on the first insulation layer 12 so that the second wiring layer 13 is covered. A material and a thickness of the second insulation layer 14 may be, for example, the same as those of the first insulation layer 12, respectively.

The third wiring layer 15 is formed on the second insulation layer 14. The third wiring layer 15 is configured to include via wirings filled in second via holes 14x that go through the second insulation layer 14 thereby to allow part of the upper layer of the second wiring layer 13 to be exposed, and a wiring pattern formed on the second insulation layer 14. The third wiring layer 15 is electrically connected with the second wiring layer 13 by way of the via wirings in the second via holes 14x. A material and a thickness of the wiring pattern of the third wiring layer 15 may be, for example, the same as those of the second wiring layer 13, respectively.

The third insulation layer 16 is formed on the second insulation layer 14 so that the third wiring layer 15 is covered. A material and a thickness of the third insulation layer 16 may be, for example, the same as those of the first insulation layer 12, respectively.

The fourth wiring layer 17 is formed on the third insulation layer 16. The fourth wiring layer 17 is configured to include via wirings filled in third via holes 16x that go through the third insulation layer 16 thereby to allow parts of the upper layer of the third wiring layer 15 to be exposed within the third via holes 16x, and a wiring pattern formed on the third insulation layer 16. The fourth wiring layer 17 is electrically connected with the third wiring layer 15 by way of the via wirings in the third via holes 16x. A material and a thickness of the wiring pattern of the fourth wiring layer 17 may be, for example, the same as those of the second wiring layer 13, respectively. Incidentally, a surface of the wiring substrate 10 on the side of the fourth wiring layer 17 may be referred to as a second primary surface.

The fourth insulation layer 18 is formed on the third insulation layer 16 so that the fourth wiring layer 17 is covered. The fourth insulation layer 18 functions as a so-called solder resist layer. A thickness of the fourth insulation layer 18 may be, for example, 50 μm. The fourth insulation layer 18 has openings 18x and thus parts of the fourth wiring layer 17 are exposed within the openings 18x of the fourth insulation layer 18.

Metal layers may be formed on parts of the fourth wiring layer 17 that are exposed within the openings 18x, if necessary. The metal layers may be, for example, an Au layer, a Ni/Au layer (a metal layer composed of a Ni layer and an Au layer stacked in this order), and a Ni/Pd/Au layer (a metal layer composed of a Ni layer, a Pd layer, and an Au layer stacked in this order), or the like. The fourth wiring layer 17 (or the metal layers when the metal layers are formed on the parts of the fourth wiring layer 17 exposed within the openings 18x) functions as connected pads for connecting lead pins 20 thereon.

In wiring substrate 1, the via holes 12x, 14x, and 16x formed in each of the corresponding insulation layers are open toward the fourth insulation layer 18 and closed at the bottoms with the corresponding wiring layers. In addition, the via holes 12x, 14, and 16x have shapes of a circular truncated cone concave having a top area larger than a bottom area. Moreover, the via wirings are formed in the via holes 12x, 14x, and 16x.

The lead pins 20 serve as external connection terminals, and are connected with the corresponding parts (as the connection pads) of the fourth wiring layer 17 that are exposed within the openings 18x (or with the corresponding metal layers when the metal layers are formed on the fourth wiring layer 17) by way of the electrically conductive members 19. The lead pins 20 may be, for example, nail head-like pins each of which has a rod-like pin part and a head portion provided in an end portion of the pin part. The head portion of the nail head-like pin may have a shape of a circular plate, or a hemisphere that protrudes toward the connection pads. The head portions of the lead pins 20 are coupled with the connection pads by way of the electrically conductive members 19.

The electrically conductive members 19 are preferably made of, for example, a solder having a higher melting point than solder to be used for the bumps 25 or the other electrically conductive members. As an example of the material of the electrically conductive members 19, there is tin-antimony (Sn—Sb) alloy or the like. The tin-antimony alloy having antimony of about 10% has a melting point of about 246° C.

The stiffener member 22 is a board-like member having openings 22x and 22y, and attached on the first insulation layer 12 of the substrate body 10 by way of the adhesive layers 21. The stiffener member 22 is provided in order to increase strength of the entire substrate body 10, and in order to reduce warpage of the substrate body 10 that may be caused by thermal and mechanical stress. Namely, because the substrate body 10, which is the coreless multilayer wiring substrate, has relatively low stiffness and is likely to be warped, the stiffener member 22 is provided to increase stiffness and reduce the warpage of the substrate body 10.

From the viewpoint of reducing the warpage, a material having a linear expansion coefficient that is the same as or close to that of the substrate body 10 is preferably selected as the material of the stiffener member 22. Because the linear expansion coefficient is about 20-25 ppm/° C. when a main constituting material of the substrate body 10 is a resin, SUS304 (stainless steel of which main constituting materials are chromium (Cr) and Nickel (Ni): 0.08C-18Cr-8Ni) or the like having a linear expansion coefficient of about 17.3 ppm/° C. is preferably used as the material of the stiffener member 22. However, any materials other than SUS304 may be used to make the stiffener member 22 as long as the material has a linear expansion coefficient that is the same as or close to that of the substrate body 10. For example, resin boards such as glass epoxy boards and metal boards such as a copper board and a copper alloy board may be used as the material of the stiffener member 22.

A thickness of the stiffener member 22 is preferably two times or more greater than the thickness of the substrate body 10, from the viewpoint of reducing the warpage. For example, a thickness of the stiffener member 22 is preferably about 700 µm or more, or for example, about 1 mm, when the thickness of the substrate body 10 is about 350 µm.

An area exposed within the opening 22x of the stiffener member 22 is an electric part mounting area in which an electronic part is mounted. An area exposed within the opening 22y of the stiffener member 22 is a semiconductor chip mounting area in which a semiconductor chip is mounted after the wiring substrate 1 is completed.

For example, as for a material of the adhesive layer 21, a silicone thermosetting type adhesive may be used. Because a silicone based adhesive (a linear expansion coefficient is about 250 ppm/° C.) is flexible, influence caused by different thermal expansions between the substrate body 10 and the stiffener member 22 when they are heated can be reduced.

The electric parts 24 are mounted on the corresponding portions of the first wiring layer 11 (the first layer 11a), the portions being exposed within the corresponding openings 22x of the stiffener member 22. Namely, the portions of the first wiring layer 11 (the first layer 11a) that are exposed within the corresponding openings 22x function as connection pads for mounting the electric parts 24. The electric parts 24 may be chip capacitors. Alternatively, the electric parts 24 may be chip resistors, inductors, or the like, rather than the chip capacitors.

Incidentally, the electric parts 24 are not necessarily mounted. In this case, the first wiring layer 11 (the first layer 11a) for mounting the electric parts 24 is not formed in the substrate body 10, and the openings 22x are not formed in the stiffener member 22.

The bumps 25 are formed on the corresponding portions of the first wiring layer 11 (the first layer 11a), the portions being exposed within the corresponding opening 22y of the stiffener member 22. The bumps 25 are provided to serve as electrical connections with corresponding connection pads of the semiconductor chip 40 to be mounted in the areas. A diameter of each of the bumps 25 may be about 100 µm. The bumps 25 may be, for example, solder bumps and the like.

A material of the bumps 25 as the solder bumps may be, for example, tin-silver-copper alloy (Sn—Ag—Cu alloy) such as Sn-3.0Ag-0.5Cu, tin-copper alloy (Sn—Cu alloy) such as Sn-0.7Cu, or the like. The Sn—Ag—Cu alloy has a melting point of about 220° C., and the Sn—Cu alloy has a melting point of about 230° C.

(Method of Producing the Wiring Substrate)

Next, a method of producing the wiring substrate according to an embodiment of the present invention is explained with reference to FIGS. 6 through 14, each of which illustrates a producing process.

Figure 6:
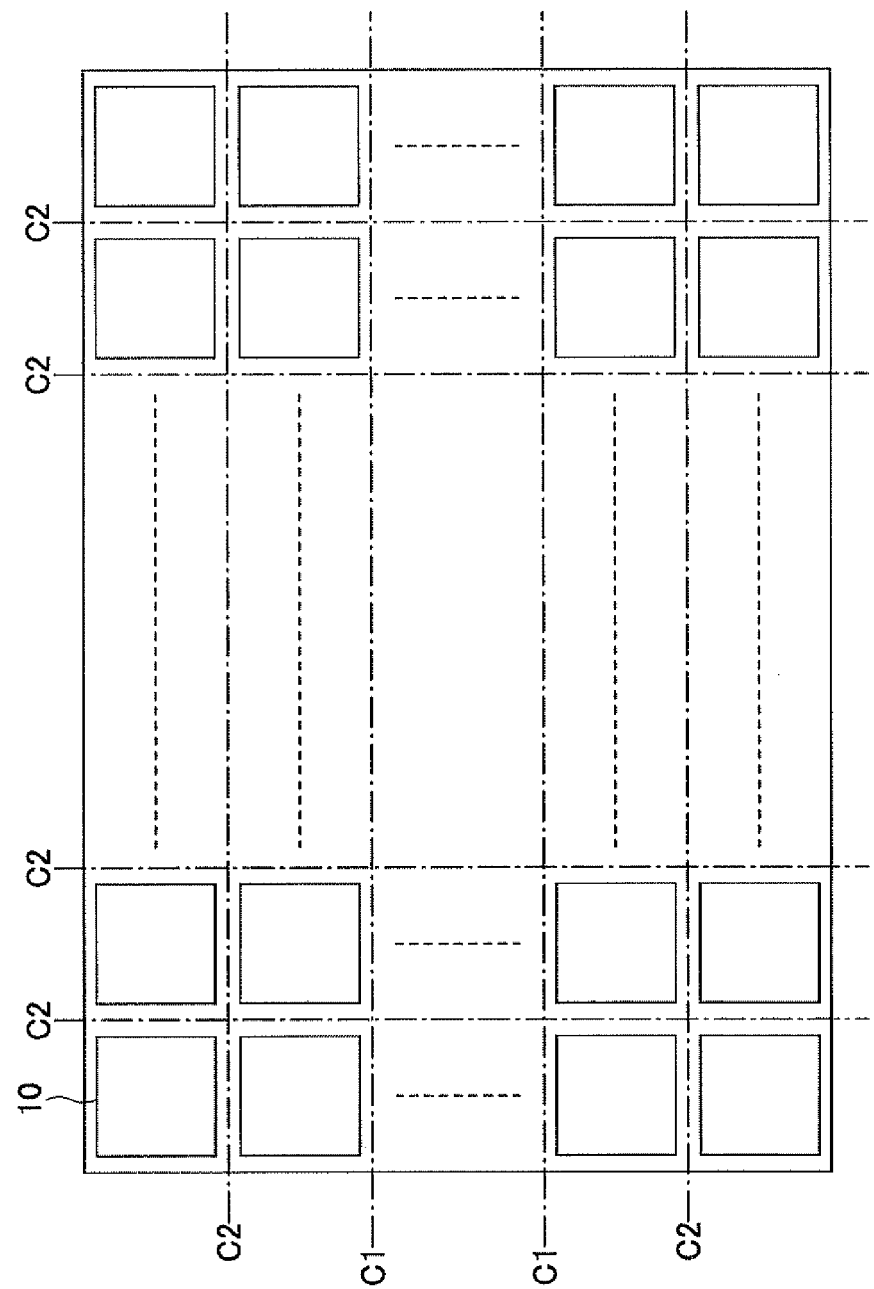
FIG. 6 is an explanatory view for explaining a production process of the wiring substrate according to the embodiment of the present invention.
Figure 7:
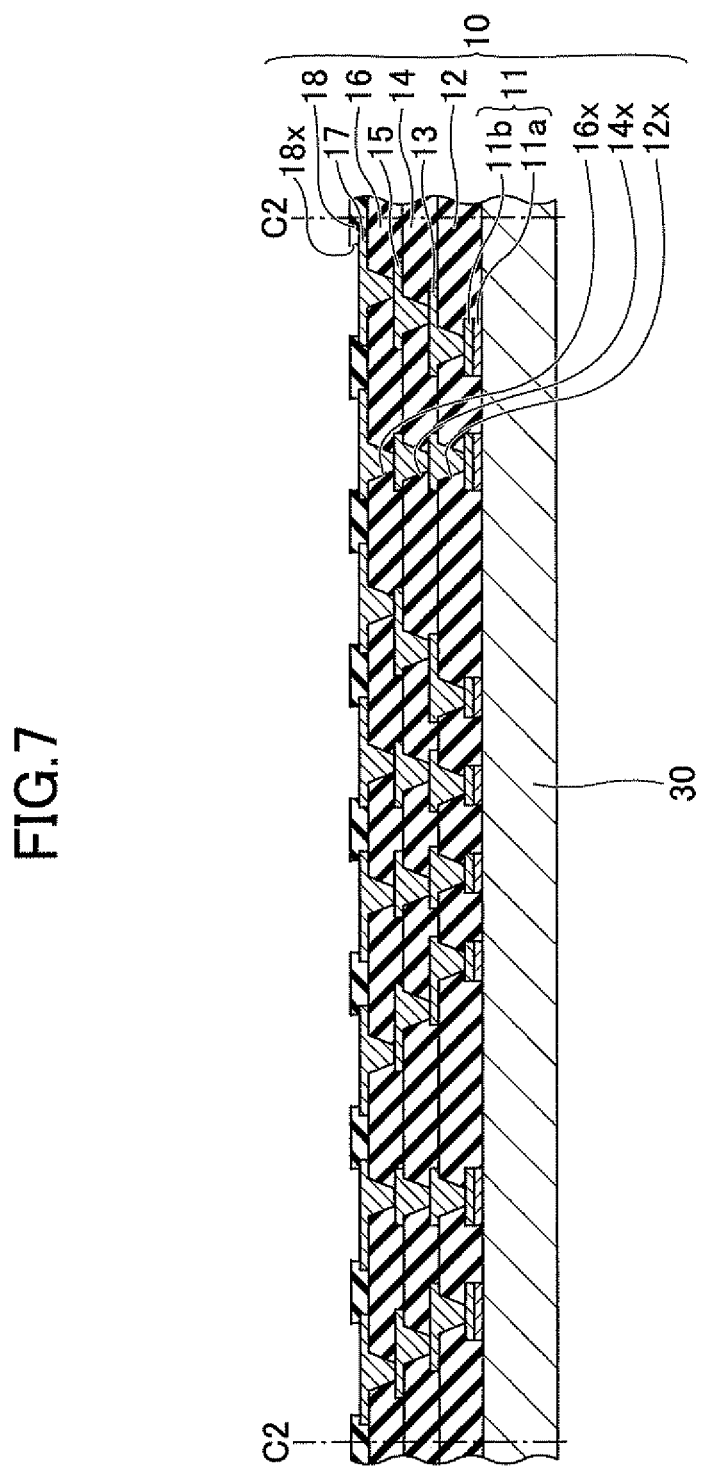
FIG. 7 is another explanatory view for explaining the production process of the wiring substrate according to the embodiment of the present invention, following FIG. 6.

First, a substrate composed of one or more substrate bodies 10 that are integrally configured on a support plate 30 is produced in processes illustrated in FIGS. 6 and 7. FIG. 6 is a plan view of the substrate; and FIG. 7 is a partial enlarged cross-sectional view of the substrate. In FIGS. 6 and 7, chain lines C1 indicate first cutting lines (referred to as first cutting lines C1 hereinafter), and chain lines C2 indicate second cutting lines (referred to as second cutting lines C2 hereinafter).

As the support plate 30, for example, a silicon plate, a glass plate, a metal foil, or the like may be used. In this embodiment, a copper foil is used for the support plate 30, because the copper foil can be used for a plating power feeding layer of an electroplating when producing the substrate body 10, and can be easily removed by etching in a process illustrated in FIG. 8. A size of the support plate 30 may be, for example, 500 mm (width)×300 mm (depth)×350 µm (thickness). Incidentally, although the support plate 30 having a square top view is exemplified here, a shape of the support plate 30 may have an arbitrary shape.

The one or more substrate bodies 10 can be produced in accordance with a known producing method, which includes, for example, a so-called build-up method in which the first wiring layer 11 including the first layer 11*a* and the second layer 11*b* is formed on the support plate 30 by electroplating with the support plate 30 used for the plating power feeding layer, subsequent insulation layers and wiring layers are alternately stacked, and the wiring layers are mutually connected with via wirings. Materials and thicknesses of the wiring layers and the insulation layers may be set as explained above.

In addition, the one or more substrate bodies 10 may be produced in accordance with processes illustrated in FIGS. 1 through 5 in Japanese Patent Publication No. 4334005. Namely, a large copper foil and a small copper foil are placed on a prepreg, and then heated and pressurized thereby to prepare a provisional substrate (support plate). Next, the wiring layers and the insulation layers are stacked on the copper foils thereby to obtain the substrate body, and then the substrate body and the copper foils are removed from the provisional substrate. Finally, the copper foils are removed from the substrate body thereby to obtain the substrate bodies 10.

Incidentally, while three-layer build-up wiring layers (the second wiring layer 13, the third wiring layer 15, and the fourth wiring layer 17) are formed in this embodiment, n-layer build-up wiring layers (n is an integer greater than or equal to one) may be formed.

Figure 8:
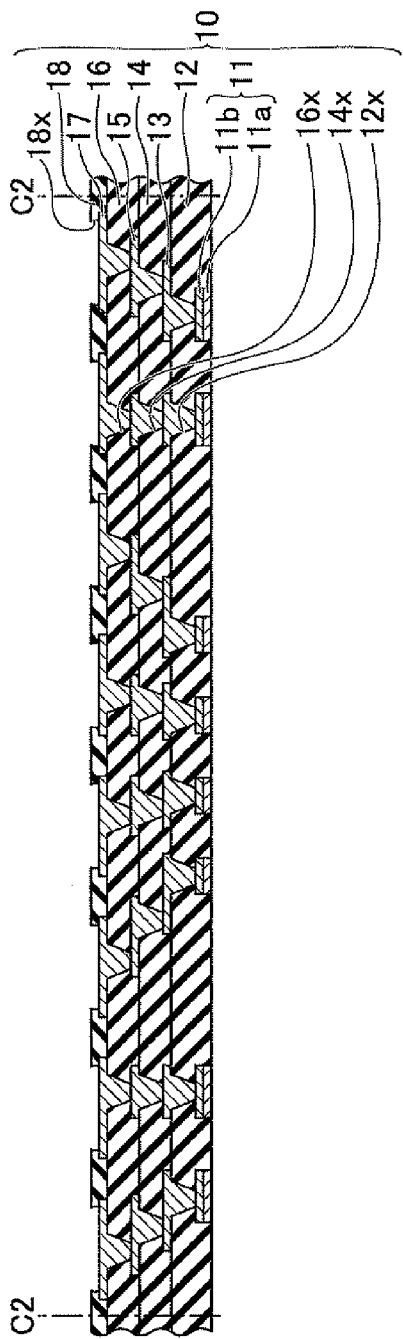
FIG. 8 is another explanatory view for explaining the production process of the wiring substrate according to the embodiment of the present invention, following FIG. 7.

Next, the support plate 30 illustrated in FIG. 7 is removed in a process illustrated in FIG. 8. The support plate 30 formed of the copper foil may be etched by using an etching solution such as aqueous ferric chloride ($FeCl_3$), aqueous cupric chloride ($CuCl_2$), aqueous ammonium persulfate ($(NH_4)_2S_2O_8$), and the like. In this case, because the uppermost layer of the first wiring layer 11 exposed in the first insulation layer 12 is made of gold as stated above, the support plate 30 made of copper can be selectively etched. Incidentally, when the fourth wiring layer 17 is made of copper, the fourth wiring layer 17 needs to be masked in order to prevent the fourth wiring layer 17 from being etched.

Figure 9:
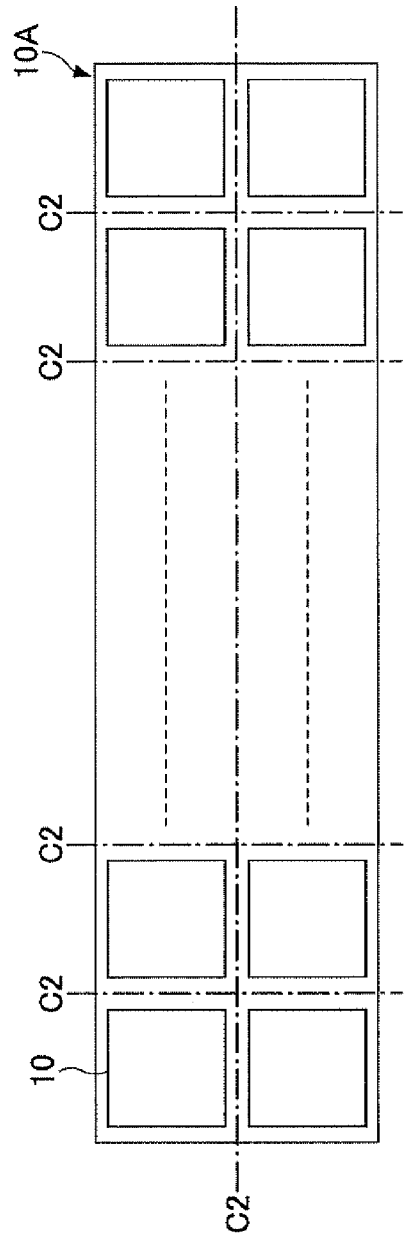
FIG. 9 is another explanatory view for explaining the production process of the wiring substrate according to the embodiment of the present invention, following FIG. 8.

Next, the obtained structure illustrated in FIG. 8 is cut along the first cutting lines C1 illustrated in FIG. 6 in a process illustrated in FIG. 9, thereby producing one or more collective entities 10A including the one or more substrate bodies 10. Each of the collective entities 10A corresponds to one-third of the entire substrate including the one or more substrate bodies 10 illustrated in FIG. 6. Incidentally, the structure is cut into the collective entities 10A by using, for example, a dicing blade and the like.

Figure 10:
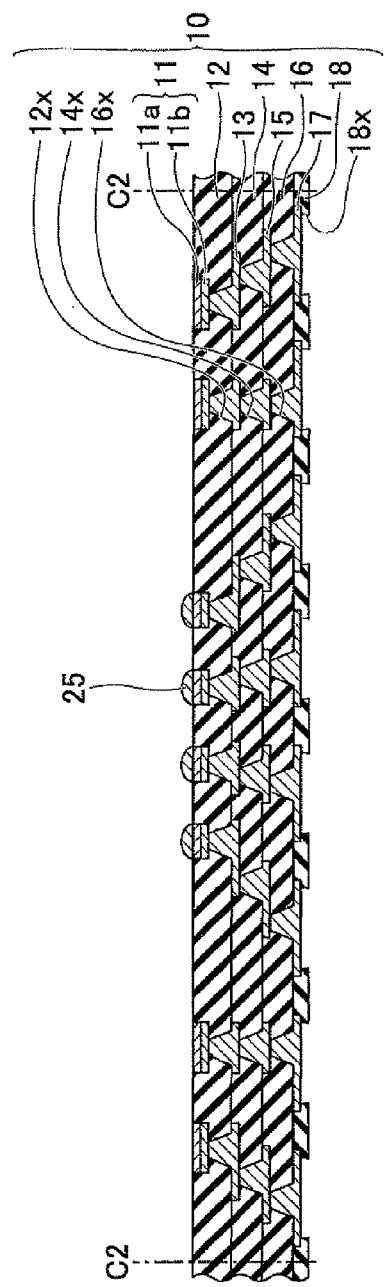
FIG. 10 is another explanatory view for explaining the production process of the wiring substrate according to the embodiment of the present invention, following FIG. 9.

The collective entities 10A are produced in the process illustrated in FIG. 9 in order to print solder pastes with superior positional accuracy in the next process illustrated in FIG. 10 and at the same time to simplify a production process. Namely, when the solder pastes are printed all together on the one or more substrate bodies 10 illustrated in FIG. 6 (before cutting), the solder pastes may be printed in positions deviated from the desired positions because the printing is carried out in a large area, which may cause a mask to be used in the printing process to be deviated, while the production process can be simplified.

On the other hand, if the solder pastes are printed on the substrate bodies 10A into which the entire structure illustrated in FIG. 6 have been separated, the production process becomes complex because the solder pastes need to be printed on each of the substrate bodies 10, while the mask is less likely to be deviated because the print area is narrow. From these reasons, the collective entities 10A are produced, which enables both the positional accuracy of the solder pastes and the simplified production process. The number of the substrate bodies 10 included in the collective entity 10A may be arbitrarily determined as long as the solder pastes are printed in positions within a permissible range.

Next, the bumps 25 are formed on the first wiring layer 11 (the first layer 11*a*) in the semiconductor chip mounting area of each of the substrate bodies 10 in each of the collective entities 10A in the process illustrated in FIG. 10. The semiconductor chip mounting area is an area exposed within the opening 22*y* of the stiffener member 22 that is mounted later. The bumps 25 are electrically connected with corresponding connection pads of the semiconductor chip after the wiring substrate 10 is completed. Incidentally, the wiring substrate 10 is illustrated upside-down in FIG. 10, compared with the wiring substrate 10 illustrated in FIG. 8 and the like.

The bumps 25 may be made of, for example, solder bumps. When the bumps 25 are formed with the solder bumps, the solder pastes are printed by using a mask that has openings in positions corresponding to portions of the first wiring layer 11 (the first layer 11*a*) on which the bumps 25 are respectively formed. Then, after the mask is removed, a reflow process is carried out thereby to form the bumps 25. A material of the solder bumps for the bumps 25 may be, for example, tin-silver-copper alloy (Sn—Ag—Cu alloy) such as Sn-3.0Ag-0.5Cu, tin-copper alloy (Sn—Cu alloy) such as Sn-0.7Cu, or the like. The Sn—Ag—Cu alloy has a melting point of about 220° C., and the Sn—Cu alloy has a melting point of about 230° C.

Figure 11:
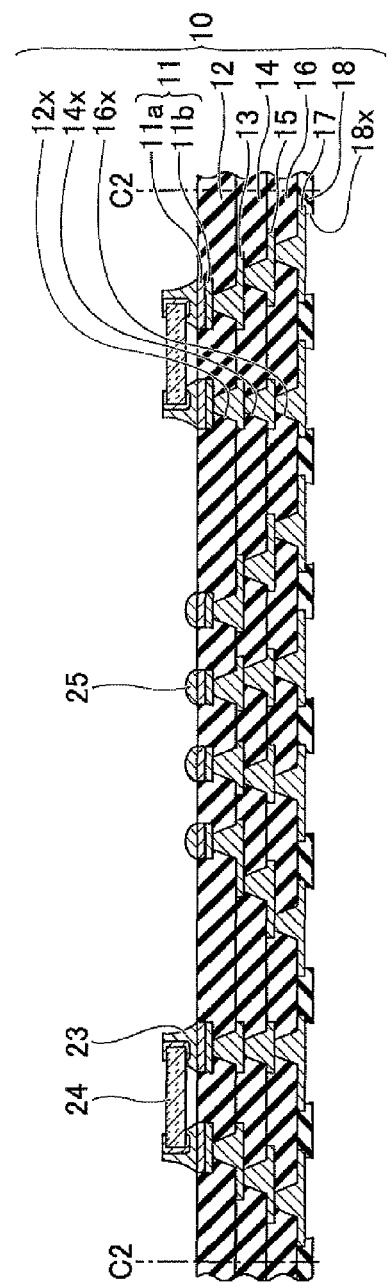
FIG. 11 is another explanatory view for explaining the production process of the wiring substrate according to the embodiment of the present invention, following FIG. 10.

Next, the electric parts 24 are mounted in the electric part mounting area of the first wiring layer 11 (the first layer 11*a*) in each of the substrate bodies 10 included in each of the collective entities 10A in a process illustrated in FIG. 11. The semiconductor parts 24 may be mounted first by printing the solder pastes with a mask that has openings in positions corresponding to portions of the first wiring layer 11 (the first layer 11*a*) on which the electrically conductive members 23 are respectively formed. Next, after the mask is removed, the electric parts 24 are mounted so that electrodes of the electric parts 24 are placed on the corresponding solder pastes and then a reflow process is carried out. As for the solder pastes for the electrically conductive member 23, the same material as those for the bumps 25 exemplified in the process illustrated in FIG. 10 may be used.

The electric part mounting area is an area exposed within the openings 22*x* of the stiffener member 22 that is mounted later. The electric parts 24 may be chip capacitors. Alternatively, the electric parts 24 may be chip resistors, inductors, or the like, rather than the chip capacitors.

Figure 12:
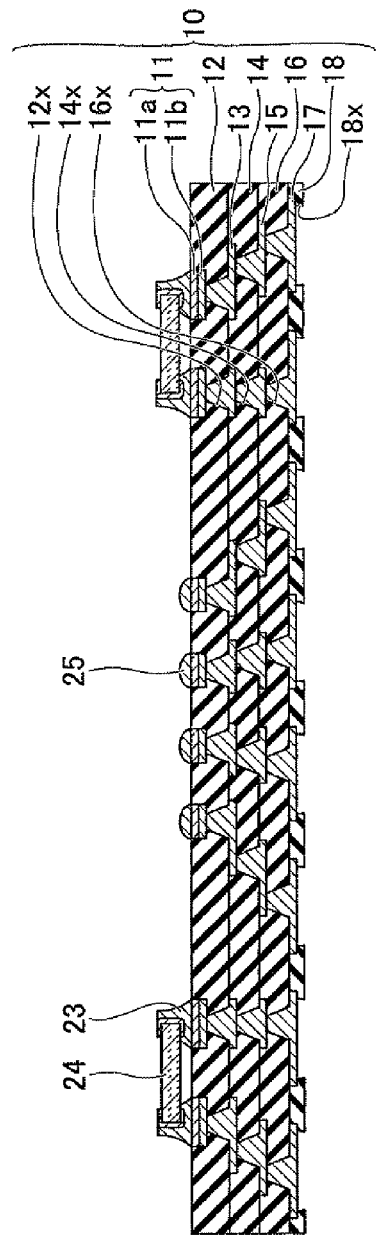
FIG. 12 is another explanatory view for explaining the production process of the wiring substrate according to the embodiment of the present invention, following FIG. 11.

Next, each of the collective entities 10A is cut along the second cutting lines C2, thereby to obtain one or more separated substrate bodies 10 in a process illustrated in FIG. 12. The collective entities 10A may be cut by using, for example, a dicing blade and the like.

Figure 13:
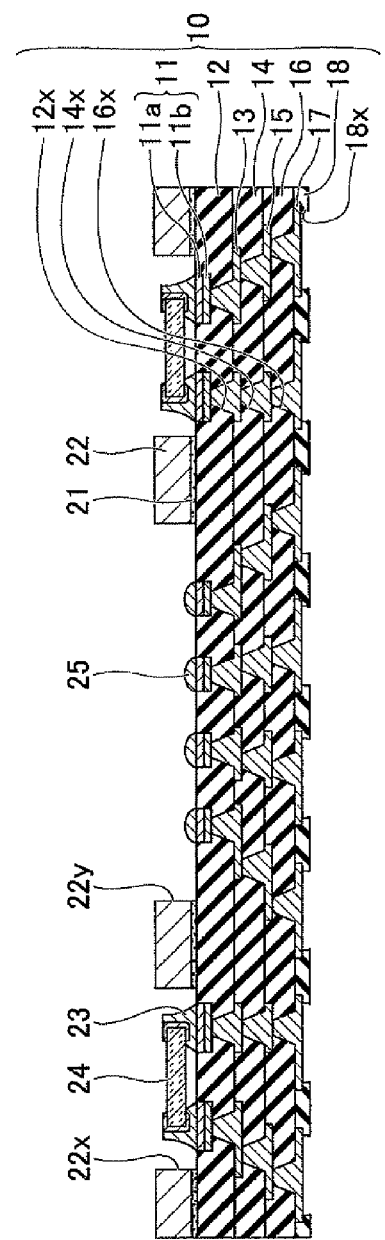
FIG. 13 is another explanatory view for explaining the production process of the wiring substrate according to the embodiment of the present invention, following FIG. 12.

Next, the stiffener members 22 having the openings 22*x* and 22*y* are attached on the corresponding first insulation layer 12 of each of the substrate bodies 10 by way of the adhesive layers 21 in a process illustrated in FIG. 13. As for a material of the adhesive layer 21, a silicone thermosetting adhesive may be used. The adhesive layer 21 made of such adhesive can be hardened at a temperature of 150° C. for about an hour. The stiffener member 22 may be formed of, for example, SUS304 and the like. A thickness of the stiffener member 22 may be, for example, about 1 mm.

Incidentally, the processes illustrated in FIGS. 12 and 13 are carried out in the opposite order. Namely, after the stiffener members 22 are attached on the corresponding substrate bodies 10 of each of the collective entities 10A with a clearance between the adjacent two stiffener members 22, the collective entities 10A are cut between the clearances, i.e., along the second cutting lines C2. With this, the same structures as those illustrated in FIG. 13 can be obtained.

According to this order of the processes, the production process can be simplified. In addition, even if the adhesive layers 21 are projected out from the boundary between the stiffener members 22 and the underlying layer, the area with the projected adhesive layers are cut by, for example, the cutting blade. Therefore, the projected adhesive layers 21 are not left in the substrate bodies 10.

Figure 14:
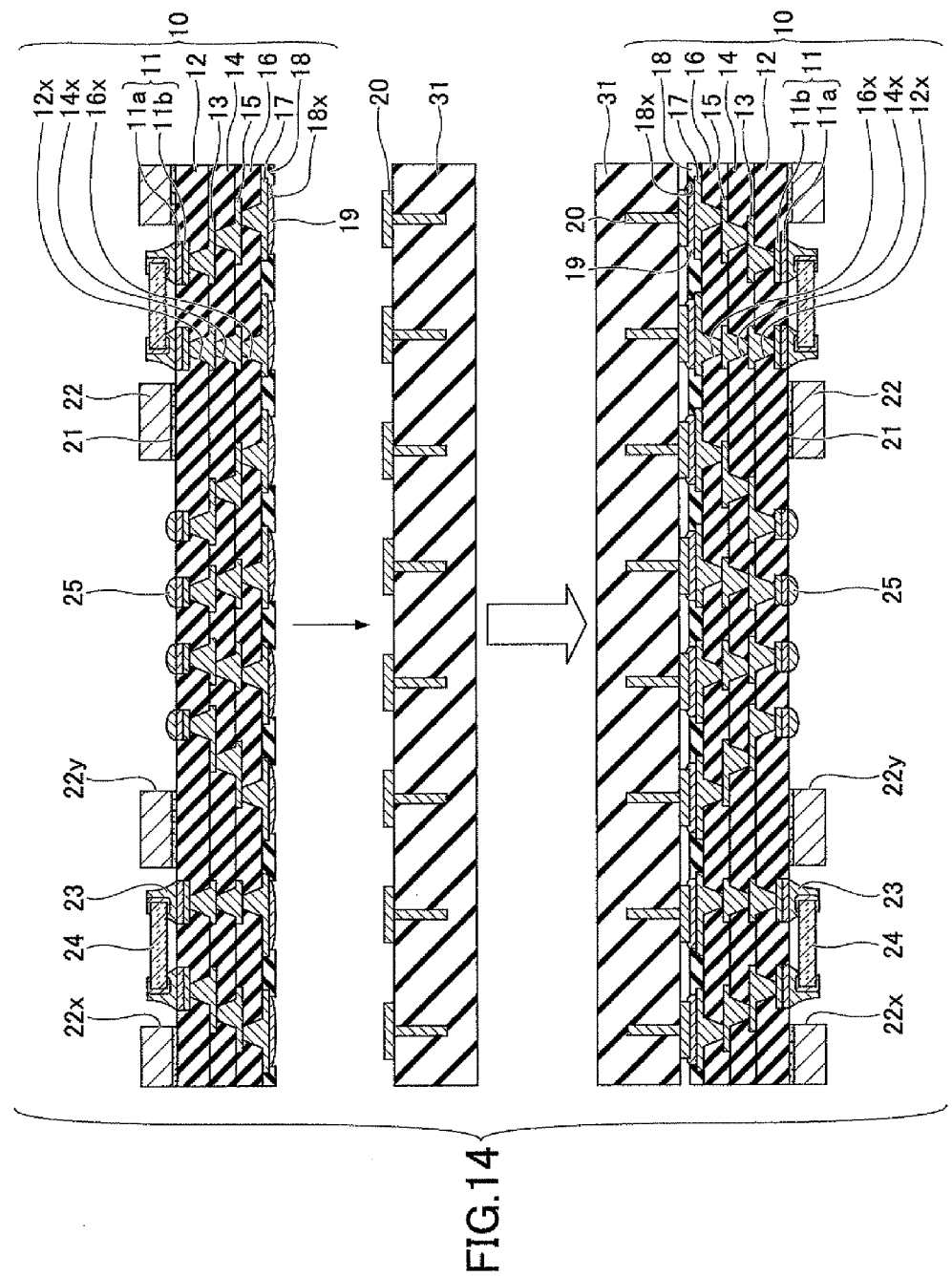
FIG. 14 is another explanatory view for explaining the production process of the wiring substrate according to the embodiment of the present invention, following FIG. 13.

Next, the lead pins 20 are coupled to portions of the fourth wiring layer 17 (or the metal layer when it is formed on the fourth wiring layer 17), the portions being exposed within the openings 18x of each of the substrate body 10 in a process illustrated in FIG. 14. Specifically, one end (a distal end) portion of each of the lead pins 20 is inserted in a jig 31. The jig 31 is provided with one or more holes having a diameter that leaves a predetermined clearance with respect to the rod portions of the lead pins 20 when the rod portions are inserted into the corresponding holes. The lead pins 20 are inserted into the corresponding holes by using, for example, an automatic inserting machine.

Next, the substrate body 10 having the electrically conductive members 19 such as solder pastes formed on the fourth wiring layer 17 (the metal layer when it is formed on the fourth wiring layer 17) exposed within the openings 18x is placed on the jig 31 having the lead pins 20, so that the other end (head) portions of the lead pins 20 come into contact with the corresponding electrically conductive members 19. Then, the substrate body 10 and the jig 31 are reversed upside down, and brought into a reflow furnace. Next, the substrate body 10 with the jig 31 placed thereon is heated at a temperature higher than the melting point of the electrically conductive members 19 thereby to melt the electrically conductive members 19. With this, the lead pins 20 are attached on the corresponding portions of the fourth wiring layer 17 (or the metal layer when it is formed on the fourth wiring layer 17) by way of the electrically conductive members 19. After this reflow process, the jig 31 is removed, thereby to complete the wiring substrate 1 illustrated in FIGS. 4 and 5.

When the solder material is used for the electrically conductive members 19 and the bumps 25, the electrically conductive members 19 are preferably formed of a material having a higher melting point than a solder material for the bumps 25 (or high melting point solder). Specifically, when the bumps 25 are formed of Sn—Ag—Cu alloy or Sn—Cu alloy (a melting point: about 220 through 230° C.), the electrically conductive members 19 are preferably formed of high melting point alloy such as tin-antimony (Sn—Sb) alloy.

Because a melting point of the tin-antimony (Sn—Sb) alloy having antimony of about 10% is about 246° C., the melting point of the electrically conductive members 19 is higher than that of the bumps 25. As a result, after the semiconductor chip is mounted on the wiring substrate 1, the wiring substrate 1 is heated to a temperature higher than the melting point of the bumps 25 and lower than the melting point of the electrically conductive members 19 at the reflow process, so that only the bumps 25 are melted without causing the electrically conductive members 19 to be melted. Therefore, when the semiconductor chip is mounted, the lead pins 20 are prevented from being deviated from appropriate positions.

Incidentally, when the silicone based adhesive is used for the adhesive layers 21 in the process illustrated in FIG. 13, gas, which may contain evaporated silicone, is evaporated from the adhesive, and then the evaporated silicone may be adsorbed on the upper surface of the substrate body 10. When silicone is adsorbed on the upper surface of the substrate body 10, electrical connection failures may be caused between the bumps 25 and the connection pads of the semiconductor chip when the semiconductor chip is mounted on the wiring substrate 1. In order to avoid such failures, a process of removing the silicone adsorbed on the upper surface of the substrate body 10 is preferably carried out after the process illustrated in FIG. 13 and before the wiring substrate 1 is completed.

In order to remove the silicone adsorbed on the upper surface of the substrate body 10, for example, an oxygen plasma cleaning process is preferably carried out. In the oxygen plasma cleaning process, oxygen plasma is generated by introducing oxygen gas to a high frequency electric field thereby activating the oxygen gas into oxygen plasma, and the upper surface of the substrate body 10 is exposed to the oxygen plasma. The oxygen plasma cleaning process may be carried out under conditions of, for example, high frequency power of about 250 W, an oxygen gas flow rate of 15 standard cubic centimeters per minute (sccm), and a process time of about 30 seconds.

In addition, a process of planarizing apex portions of the bumps 25 may be carried out after the process illustrated in FIG. 14. The apex portion of the bumps 25 are planaraized by pushing the apex portions onto a flat surface of a metal member, for example. By planarizing the apex portions of the bumps 25, electrical connection between the bumps 25 and the connection pads of the semiconductor chip becomes more reliable.

Figure 15:
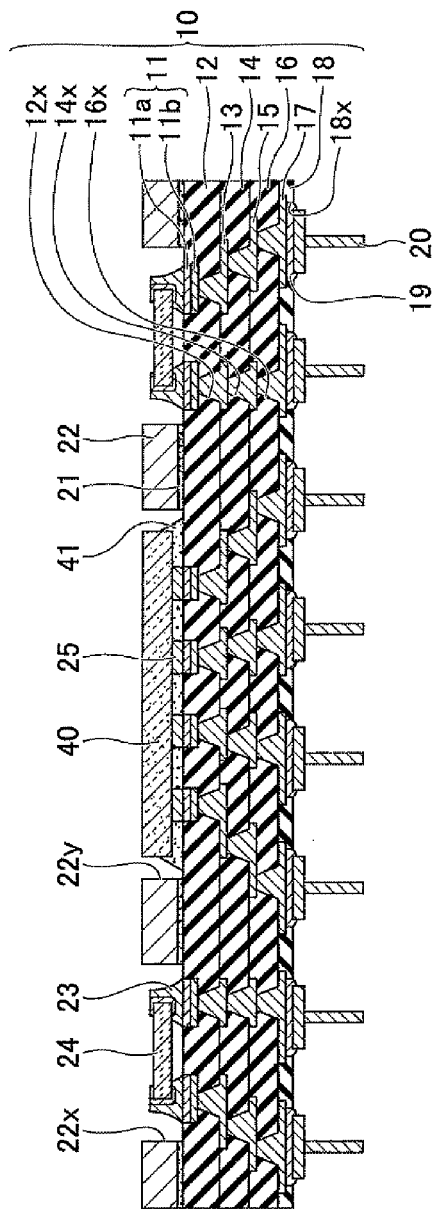
FIG. 15 is an explanatory view for explaining a production process of a semiconductor package that employs the wiring substrate according to the embodiment of the present invention.
Figure 16:
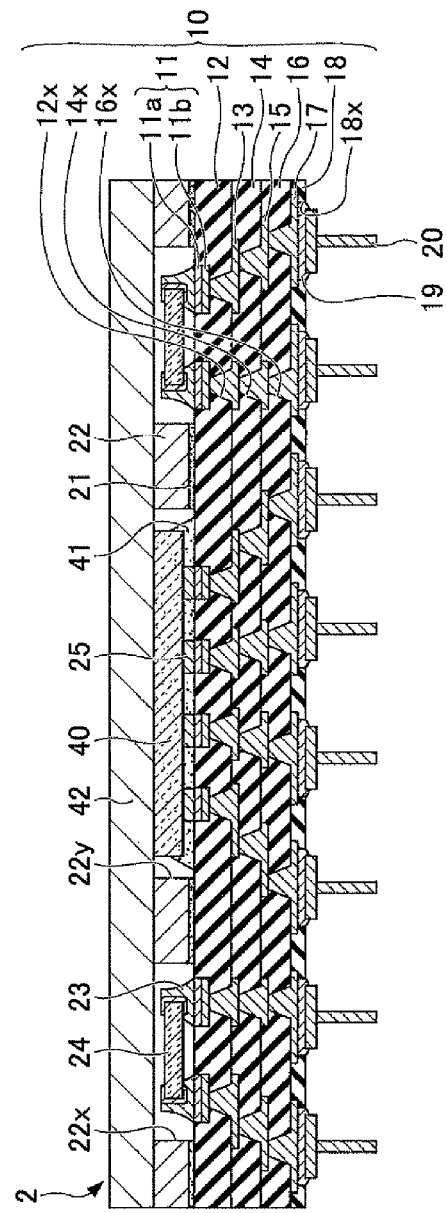
FIG. 16 is an explanatory view for explaining a production process of a semiconductor package that employs the wiring substrate according to the embodiment of the present invention, following FIG. 15.

While the wiring substrate 1 is completed with the above series of processes, other processes illustrated in FIGS. 15 and 16 may be carried out in order to produce a semiconductor package 2.

First, the wiring substrate 1 completed with the process illustrated in FIG. 14 is reversed upside down, and the semiconductor chip 40 is mounted on the wiring substrate 1 by way of the bumps 25 in a process illustrated in FIG. 15. Specifically, the semiconductor chip 40 is placed on the wiring substrate 1 so that the connection pads (not illustrated) of the semiconductor chip 40 come into contact with the corresponding bumps 25. Then, the wiring substrate 1 on which the semiconductor chip 40 is placed is brought into the reflow furnace, and heated in order to melt the bumps 25. After the wiring substrate and the semiconductor chip 40 are cooled, the semiconductor chip 40 is mounted. Next, an under-fill resin 41 is filled in an area surrounding the bumps 25 between the semiconductor chip 40 and the wiring substrate 1.

A lid part 42 is attached on the stiffener member 22 of the structure illustrated in FIG. 15 in a process illustrated in FIG. 16, so that the semiconductor package 2 is completed. The lid part 42 may be formed of, for example, metal such as copper, and is attached on the stiffener member 22 with, for example, a silicone based adhesive. In this case, an area surrounding the semiconductor chip 40 and the electric parts 24 may be filled with the silicone based adhesive. In addition, thermal grease may be applied between the semiconductor chip 40 and the lid part 42 in order to attach the lid part 42 on the semiconductor chip 40. Incidentally, the structure illustrated in FIG. 15 may be a completed semiconductor package 2, instead of the structure illustrated in FIG. 16.

According to the embodiment of the present invention, the stiffener member 22 is attached on the substrate body 10 and then the lead pins 20 are mounted, thereby to complete the wiring substrate 1. Then, the semiconductor chip 40 is mounted on the completed wiring substrate 1. In the semiconductor package 2 so configured, the substrate body 10 whose main constituting material is resin has a linear expansion coefficient of about 20 through 25 ppm/° C., the stiffener member 22 formed of SUS304 has a linear expansion coefficient of about 17.3 ppm/° C., and the semiconductor chip 40 whose main constituting material is silicon has a linear expansion coefficient of about 3.4 ppm/° C.

Here, a comparative mounting method in which the stiffener member 22 is attached on the substrate body 10, the semiconductor chip 40 is mounted on the stiffener member 22, and then the lead pins 20 are formed is considered. In this method, the substrate body 10 may be warped when heated in order to mount the semiconductor chip 40, even if the stiffener member 22 is used, because the substrate body 10, the stiffener member 22, and the lead pins 20 have different linear expansion coefficients. Once the substrate body 10 is warped, the lead pins 20 may be mounted in positions deviated from the desired positions in which the lead pins 20 have to be mounted. In other words, positional accuracy of the lead pins 20 is degraded.

However, according to the embodiment of the present invention, the lead pins 20 are mounted after the stiffener member 22 is attached on the substrate body 10, and the semiconductor chip 40 is mounted. In addition, the stiffener member 22 is formed of SUS304 that has a linear expansion coefficient close to that of the substrate body 10. As a result, when the lead pins 20 are mounted, warpage caused in the semiconductor chip mounting area of the substrate body 10 can be reduced, thereby improving the position accuracy of the lead pins 20.

Incidentally, the inventors of the present invention have investigated improvement of the positional accuracy of the lead pins 20 according to an embodiment of the present invention, compared with a conventional method of producing a wiring substrate in which the lead pins are attached onto the substrate body after the stiffener member and the semiconductor chip are mounted. Specifically, pin-to-pin accuracy of the lead pins 20 was evaluated by measuring pitches of two adjacent lead pins 20. As a result, it was found that the average pitch comes closer to a designed value by about 0.06 mm, and variations of the pitches are substantially halved, according to the embodiment of the present invention, compared with the conventional method. Moreover, pin-to-package accuracy was evaluated by measuring a distance of each of the lead pins 20 from the nearest peripheral edge of the semiconductor package 2. As a result, it was found that the average distance comes closer to a designed value by about 0.04 mm, and variations of the distances are substantially halved, according to the embodiment of the present invention, compared with the conventional method.

In addition, the adhesive layer 21 that attaches the stiffener member 22 onto the substrate body 10 is formed of the silicone based adhesive having flexibility, which has a linear expansion coefficient of about 250 ppm/° C. As a result, influence caused by different thermal expansion coefficients between the substrate body 10 and the stiffener member 22 when they are heated in order to mount the semiconductor chip 40 can be absorbed.

(Altered Example)

As an altered example, another method of producing a wiring substrate is exemplified. FIGS. 17 and 18 illustrate the method of producing the wiring substrate according to this altered example.

First, the one or more substrate bodies 10 are formed on the support plate 30 in a process illustrated in FIG. 17. Although the wiring layers and the insulation layers are stacked in a predetermined order from the surface of the support plate 30 on which the semiconductor chip 40 is to be mounted, in the process illustrated in FIG. 7, the wiring layers and the insulation layers are stacked in a predetermined order from the surface of the support plate 30 on which the lead pins 20 are to be mounted, in the process illustrated in FIG. 17, which is different only in this point from the process illustrated in FIG. 7.

After the process illustrated in FIG. 17, the same processes as illustrated in FIGS. 8 through 14, respectively, are carried out, and then the jig 1 is removed, thereby to obtain a wiring substrate 3 illustrated in FIG. 18.

Even with this method of producing the wiring substrate, the same effects and advantages as those of the method explained with reference to FIGS. 6 through 14 can be obtained.

Although the embodiment(s) of the present invention(s) has(have) been described in detail, it should be understood that the various changes, substitutions, and alterations could be made hereto without departing from the spirit and scope of the invention.

What is claimed is:

1. A method of producing a wiring substrate, comprising:
producing a substrate body including a first primary surface on which a semiconductor chip mounting area is provided and a second primary surface opposed to the first primary surface;
attaching a stiffener member on the first primary surface of the substrate body by an adhesive, the stiffener member including an opening which the semiconductor chip mounting area is exposed from;
exposing connection pads and an insulation layer surface at a location at which the opening of the stiffener member is provided at the semiconductor chip mounting area; and
connecting lead pins to corresponding connection pads provided on the second primary surface by way of electrically conductive members so that the lead pins are provided on the second primary surface after attaching the stiffener member on the first primary surface.

2. The method of producing a wiring substrate according to claim 1, further comprising forming an electrically conductive member on connection pads provided in the semiconductor chip mounting area, the forming being carried out between the producing the substrate body and the attaching the stiffener member.

3. The method of producing a wiring substrate according to claim 2, wherein a substrate member on which the plural of substrate bodies are provided is produced on a support member and then the support member is removed in the producing the substrate body,
wherein the substrate member is cut into plural collective entities each of which includes one or more of the substrate bodies between the producing the substrate body and the forming the electrically conductive member, and
wherein the electrically conductive member is formed on the connection pads provided in the semiconductor chip mounting area in each of the collective entities in forming the electrically conductive member.

4. The method of producing a wiring substrate according to claim 3, wherein the plural of stiffener members including respective openings are attached on the corresponding plural substrate bodies included in each of the collective entities in the attaching the stiffener member, and wherein the method of producing the wiring substrate further comprises cutting each of the collective entities on which the plural stiffener members are attached, between the adjacent stiffener members, between the attaching the stiffener member and the connecting the lead pins.

5. The method of producing a wiring substrate according to claim 3, wherein the collective entities including the one or more substrate bodies are cut before the attaching the stiffener member, and wherein the stiffener member including the opening is attached on the first primary surface of each of the substrate bodies separated from one another.

6. The method of producing a wiring substrate according to claim 1, wherein the stiffener member is attached on the first primary surface with a silicone adhesive.

7. The method of producing a wiring substrate according to claim 6, further comprising cleaning off silicone that is evaporated from the silicone adhesive and adsorbed on the first primary surface, the cleaning being carried out before the attaching a stiffener member.

8. The method of producing a wiring substrate according to claim 1, wherein a thickness of the stiffener member is two times or more greater than a thickness of the substrate body.

9. The method of producing a wiring substrate according to claim 1, wherein the stiffener member is made of stainless steel including chromium and nickel as main constituent materials.

10. The method of producing a wiring substrate according to claim 1, wherein the stiffener member further comprises another opening which an electric part area is exposed from, and wherein the method of producing the wiring substrate further comprises mounting the electric part in a position of the first primary surface, the position corresponding to the another opening.

11. The method of producing a wiring substrate according to claim 1, wherein the substrate body is a careless multilayer wiring substrate.

* * * * *